(12) United States Patent
Kuan et al.

(10) Patent No.: US 8,871,652 B2
(45) Date of Patent: Oct. 28, 2014

(54) METHOD OF MANUFACTURING A SEMICONDUCTOR TEMPLATE

(71) Applicant: Kingwave Corporation, Taipei (TW)

(72) Inventors: Chieh-Hsiung Kuan, Taipei (TW); Wen-Sheng Su, Taipei (TW)

(73) Assignee: Kingwave Corporation, Taipei (TW)

( * ) Notice: Subject to any disclaimer, the term of this patent is extended or adjusted under 35 U.S.C. 154(b) by 21 days.

(21) Appl. No.: 13/834,996

(22) Filed: Mar. 15, 2013

(65) Prior Publication Data
US 2014/0147991 A1      May 29, 2014

(30) Foreign Application Priority Data

Nov. 29, 2012   (TW) .............................. 101144726 A

(51) Int. Cl.
*H01L 21/461*      (2006.01)
*H01L 21/02*       (2006.01)

(52) U.S. Cl.
CPC ................................. *H01L 21/0243* (2013.01)
USPC ........................................................ 438/735

(58) Field of Classification Search
USPC ................................................ 438/689, 735
See application file for complete search history.

(56) References Cited

U.S. PATENT DOCUMENTS

| 2005/0196925 A1* | 9/2005 | Kim et al. ...................... 438/285 |
| 2007/0020874 A1* | 1/2007 | Xie et al. ....................... 438/423 |
| 2012/0235161 A1* | 9/2012 | Paskova et al. ................. 257/76 |

* cited by examiner

*Primary Examiner* — Bradley K Smith
(74) *Attorney, Agent, or Firm* — Rosenberg, Klein & Lee

(57) ABSTRACT

A method for manufacturing a semiconductor template balanced between strains and defects is provided, the method including steps of: preparing a substrate, dividing the substrate into a plurality of first patterned zones and a plurality of second patterned zones, the second patterned zones applied to separate the first patterned zones; selecting a semiconductor with an ideal lattice of a semiconductor buffer layer to be deposited on the substrate; etching a plurality of first microstructures in the first patterned zones according to the semiconductor with the ideal lattice, the first microstructures and the semiconductor with the ideal lattice following a lattice-structure matching relationship, discovered by strain-traction experiments, making the substrate a multi-patterned substrate; and depositing the semiconductor buffer layer having the semiconductor with the ideal lattice on the multi-patterned substrate to manufacture a semiconductor template which is balanced between strains and defects.

15 Claims, 14 Drawing Sheets

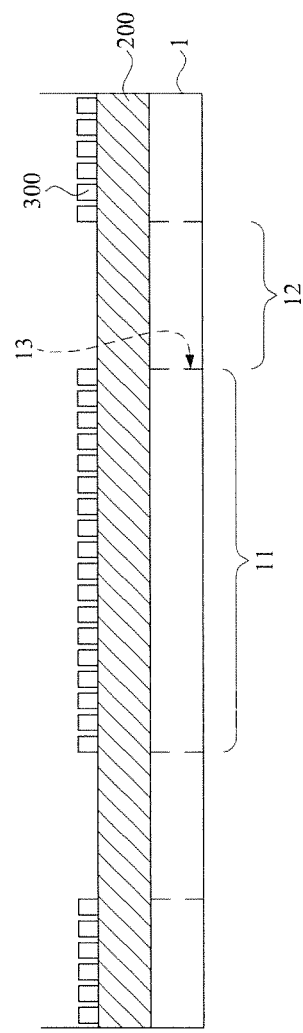
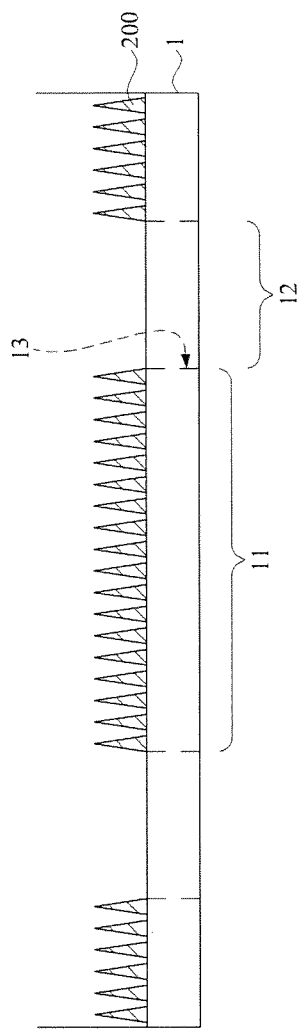
FIG.2C
FIG.2D

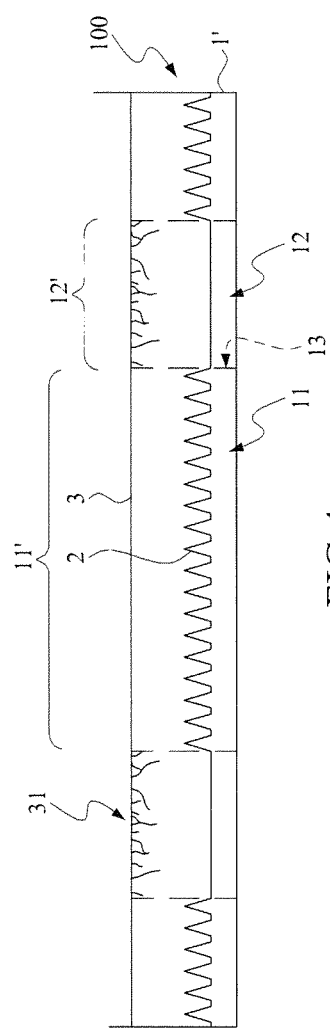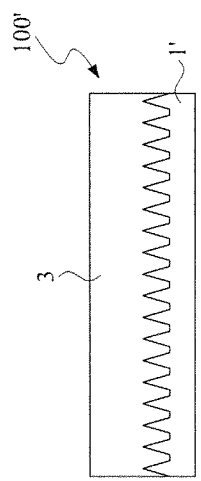
FIG.4
FIG.5

METHOD OF MANUFACTURING A SEMICONDUCTOR TEMPLATE

This application claims the benefits of the Taiwan Patent Application Serial NO. 101144726 filed on Nov. 29, 2012, the subject matter of which is incorporated herein by reference.

BACKGROUND OF THE INVENTION

1. Field of the Invention

The present invention relates to a method of manufacturing a semiconductor template and more particularly, relates to a method of manufacturing a semiconductor template by attracting strains by means of microstructures.

2. Description

The development of green technology and green policy has been thriving these years, one of the objects which the industry seeks is a power amplifier with greater performance. An ideal power amplifier is small in size, light weighted, competitive in price, reliable, with high efficiency, able to provide high power density, and able to transmit within greater ranges and different temperatures. However, the use of silicon-based power electronic devices is almost reaching its limits in semiconductor industry. Therefore, it is important to introduce new materials for the future development of power devices.

At present, the operational frequency of Nitride HEMTs on a sapphire substrate has been applied to X-band (8-12 GHz). As Nitride HEMTs is gradually utilized and developed toward high-frequency band, the corresponding gate length is shortened, which results in the self-heating effect in Nitride HEMTs under the operations of high frequency, high bias voltage, high current, high power, and especially in high frequency band. Since the thermal conductivity of sapphire substrates is lower (0.4 $Wcm^{-1}K^{-1}$), the heat generated by the Nitride HEMTs is accumulated in the transistor, and thus the self-heating effect will limit the performance of transistors and cause damages.

The thermal conductivity of a sapphire substrate is 0.4 $Wcm^{-1}K^{-1}$ while the thermal conductivity of a SiC substrate is 4.9 $Wcm^{-1}K^{-1}$ and the thermal conductivity of a Si substrate is 1.5 $Wcm^{-1}K^{-1}$—both of them have higher thermal conductivity than the sapphire substrate and thus are favored by being the substrates of high-power and high-speed GaN-based devices. Although a high-power and high-speed GaN-based device including a SiC substrate has high performance in device characteristics, the costs on SiC substrates are too high. In consideration of costs on substrates, Si substrates are cheaper than SiC substrates and sapphire substrates.

It is described in an article of June, 2008, from Nitronex Corporation that when the large-sized substrates is used, the cost on every unit area of a Si substrate is one hundred times cheaper than that of an SiC substrate; thus, utilizing GaN high speed devices on Si substrates means money and business.

Meanwhile, LEDs have many advantages such as lower energy consumption, longer lifetime, faster reaction speed, etc.; therefore, LEDs have been gradually replacing traditional lights such as bulbs and fluorescent lamps. However, the luminous efficiency of LEDs has been a target that manufacturers go for. Thus, the luminous flux of LEDs is inspected all the time during the whole process of manufacturing so as to confirm whether the luminous efficiency of LEDs meets the expectation.

Generally speaking, blue LED chips are utilized as excitation sources by white LEDs in the market. Most blue LED chips include GaN or InGaN as primary materials for light emitting, and blue LED chips include GaN-based epitaxial layer depositing on sapphire substrates. (GaN-based epitaxial layer and sapphire substrate have the same crystal structure of hexagonal close-packed lattice form.) In order to improve the luminous efficiency of LEDs further, the sapphire substrate is patterned. Owing to the use of ordered arrangement of patterns in the sapphire substrate, internal quantum efficiency is improved, and light extraction efficiency is increased. As a result, the brightness of LEDs is enhanced.

However, although the brightness of LEDs including patterned sapphire substrates is increased, the lattice constant and the thermal conductivity of GaN-based epitaxial layer and of sapphire substrates are not matching. For example, the mismatch in the lattice constant of GaN-based epitaxial layers and that of sapphire substrate is up to 16%. Therefore, if GaN-based epitaxial layers are deposited on a sapphire substrate, defects such as point defects, dislocation defects and cracks are generated due to the partial relaxation of strains in GaN-based epitaxial layers.

When different substrates can be used to grow GaN-based epitaxial layers, users can either choose a SiC substrate or a Si substrate. In the consideration of costs, utilization of Si substrates in LEDs will be the mainstream in the future. However, the mismatches in lattice constant and in thermal conductivity between the GaN-based epitaxial layer and the Si substrate are greater than that between the GaN-based epitaxial layer and the sapphire substrate, which makes it even more difficult to grow GaN-based epitaxial layers on Si substrates without defects.

Thus, a method for manufacturing a semiconductor template balanced between strains and defects is provided according to embodiments of the present invention to avoid defects generated due to mismatches in lattice constant and in thermal conductivity between the GaN-based epitaxial layer and the substrate.

SUMMARY OF THE INVENTION

In prior art, when GaN-based epitaxial layers are deposited on the substrate, defects are generated due to mismatches in lattice constant and in thermal conductivity between the GaN-based epitaxial layer and the substrate. Thus, a method for manufacturing a semiconductor template balanced between strains and defects is provided, the method utilizes microstructures to accumulate strains toward the outside of a first patterned zones, to reduce the residual strains in the first patterned zones, and to avoid generating defects in the first patterned zones.

A method for manufacturing a semiconductor template balanced between strains and defects is provided, the method including: preparing a substrate, dividing the substrate into a plurality of first patterned zones and a plurality of second patterned zones, the second patterned zones applied to separate the first patterned zones; selecting a semiconductor with an ideal lattice of a semiconductor buffer layer to be deposited on the substrate; etching a plurality of first microstructures in the first patterned zones according to the semiconductor with an ideal lattice, the first microstructures and the semiconductor with the ideal lattice following a lattice-structure matching relationship, discovered by strain-traction experiments, making the substrate a multi-patterned substrate; and depositing the semiconductor buffer layer having the semiconductor with the ideal lattice on the multi-patterned substrate to manufacture a semiconductor template which is balanced between strains and defects. when the deposition of the semiconductor buffer layer follows the lattice-structure matching relationship, discovered by strain-traction experiments in the preferred embodiment, it is expected that the semiconductor buffer layer is affected by the difference between a strain-traction force in the semiconductor with the ideal lattice on the first patterned zones and in a semiconductor with a lattice on the second patterned zones; owing to the lower lattice-constant mismatch in the semiconductor buffer layer grown on the first microstructures, the residual strains in the semiconductor buffer layer are accumulated toward the outside of the first patterned zones; as a result, the strains in the semiconductor buffer layer on the first patterned zones are relaxed.

The method further includes the second patterned zones being connected so the first patterned zones are disposed into an array among the second patterned zones.

The method further includes etching the first microstructures within the height of 0.3-10 μm in the first patterned zones.

The method further includes forming a photoresist layer on the substrate and forming the first microstructures in the first patterned zones with a photolithography process and an etching process. Further, a plurality of second microstructures in the second patterned zones are formed with the photolithography process and the etching process, and the height difference from the highest point of the first microstructures to the lowest point of the second microstructures is within 0.2-10 μm; or, the second microstructures in the second patterned zones are formed with the photolithography process and the etching process, and the height difference from the highest point of the first microstructures to the highest point of the second microstructures is within 0.05-10 μm; or, the second microstructures in the second patterned zones are formed with the photolithography process and the etching process, and the first microstructures and the second microstructures are arranged in different cycles: the first microstructures are arranged in a first cycle; the formula of the first cycle is $P1=nA \pm P1'$, P1 being the first cycle, n being a positive integer, A being lattice constant of the semiconductor buffer layer, and $P1' \leq abs(nA)*0.15$; the second microstructures are arranged in a second cycle different from the first cycle; the formula of the second cycle is $P2 \geq 10*(nA) \pm P2'$, P2 being the second cycle, n being a positive integer, A being the lattice constant of the semiconductor buffer layer, and $P2' \leq abs(10*(nA))$. Besides, a hard mask layer is formed on the substrate before the photoresist layer is formed, and the photoresist layer is formed on the hard mask layer.

The photolithography process is selected from the group of UV lithography, laser interference lithography, holographic lithography, E-beam lithography, X-ray lithography, Nano lithography and Nano imprinting; the etching process is selected from the group of wet etching and dry etching.

The area of the first patterned zones is less than 4 cm$^2$.

Materials of the semiconductor buffer layer are selected from the group of Carbon, Silicon and Germanium.

The semiconductor buffer layer includes a compound semiconductor having materials selected from the group of Group III-V, Group II-VI and Group III-VI of the periodic table.

The defects are selected from the group of point defects, dislocation defects and cracks.

Compared with prior art, when GaN-based epitaxial layers are deposited on the substrate, defects are generated due to the mismatches in lattice constant and in thermal conductivity between the GaN-based epitaxial layer and the substrate, embodiments of the present invention describe method including dividing the substrate into the first patterned zones and the second patterned zones; forming a plurality of microstructures in the first patterned zones; thus, when depositing the semiconductor buffer layer on the substrate, the method utilizes microstructures to accumulate strains toward the outside of the first patterned zones, to reduce the residual strains in the first patterned zones, and to avoid generating defects in the first patterned zones.

BRIEF DESCRIPTION OF THE DRAWINGS

Other features and advantages of this invention will become more apparent in the following detailed description of the preferred embodiments of this invention, with reference to the accompanying drawings.

Based on FIG. 2A.

Based on FIG. 2B, FIG. 2C is a cross-sectional view showing exposing the photoresist layer to light so the photoresist layer is patterned corresponding to first microstructures.

Based on FIG. 2C, FIG. 2D is a cross-sectional view showing etching the hard mask layer with the shades of the photoresist layer so the hard mask layer is patterned corresponding to the first microstructures.

Based on FIG. 2D.

FIG. 4 is a cross-sectional view showing depositing a semiconductor buffer layer on the multi-patterned substrate to manufacture a semiconductor template that is balanced between strains and defects according to the first embodiment of the present invention.

FIG. 5 is a cross-sectional view showing a defectless epitaxial substrate after removing the second patterned zones according to the first embodiment of the present invention.

DETAILED DESCRIPTION OF THE PREFERRED EMBODIMENT

The present invention relates to a method of manufacturing a semiconductor template balanced between strains and defects. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
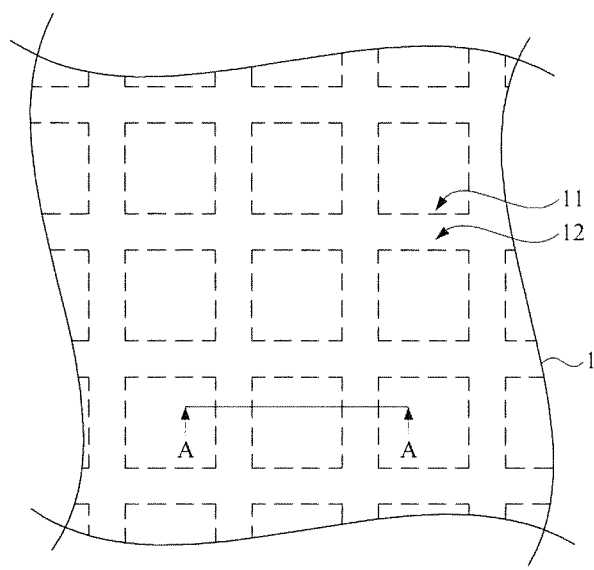
FIG. 1 is a schematic view of a substrate provided according to a first embodiment of the present invention.

Refer to FIG. 1, a schematic view of a substrate provided according to a first embodiment of the present invention. A method includes: preparing a substrate 1; dividing the substrate into a plurality of first patterned zones 11 (only one is identified with referential number in the figure) and a plurality of second patterned zones 12 (only one is identified with referential number in the figure). The substrate 11 is selected from the group of a SiC substrate, a Si substrate, a GaAs substrate, a GaN substrate, an InAs substrate, and a sapphire substrate. The second patterned zones 12 are connected as grid shaped and the first patterned zones 11 are disposed into an array among the second patterned zones 12. The area of the first patterned zones is less than 4 cm$^2$. The method then includes: selecting a semiconductor with an ideal lattice of a semiconductor buffer layer 3 (illustrated in FIG. 4) to be deposited. (By "ideal," here it means there is no strain existing in the lattice of the semiconductor buffer layer.) Given the materials of the semiconductor buffer layer 3 include GaN, the semiconductor with the ideal lattice has a hexagonal close-packed lattice structure.

Figure 2A:
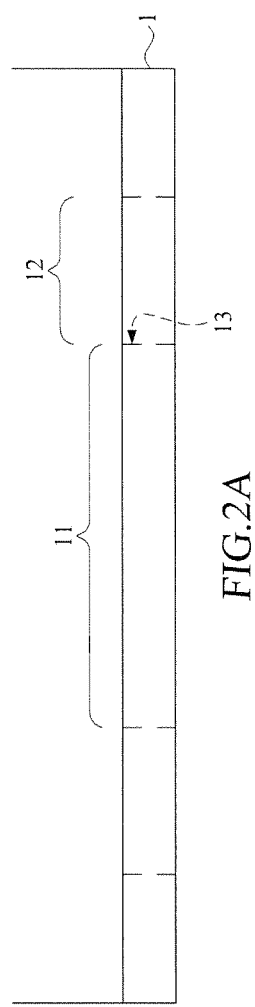
FIG. 2A is a cross-sectional view of crossing along A-A line in FIG. 1.
Figure 2B:
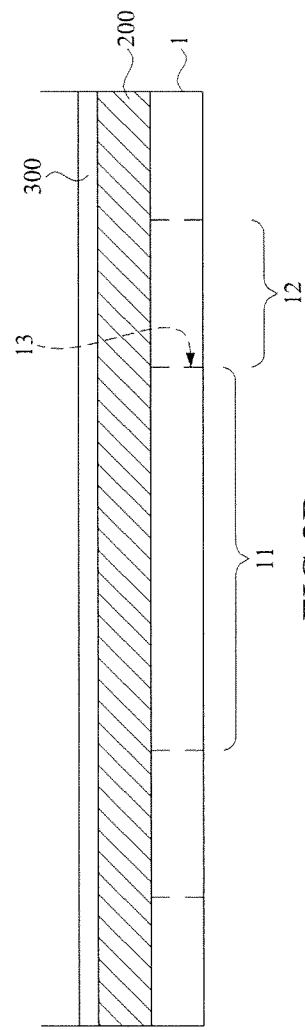
FIG. 2B is a cross-sectional view showing forming a hard mask layer and a photoresist layer on second patterned zones.
Figure 2E:
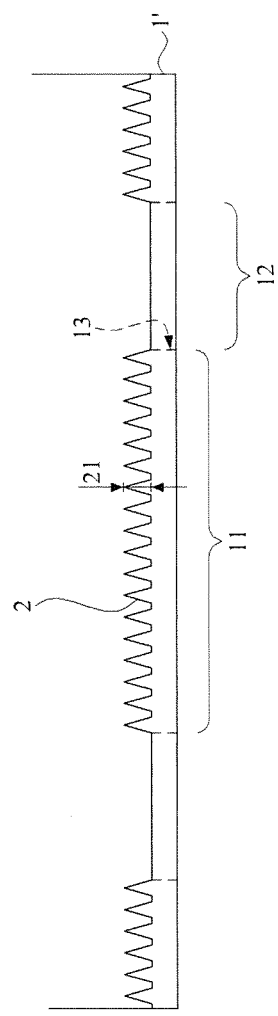
FIG. 2E is a cross-sectional view showing etching the first microstructures in the substrate with the shades of the hard mask layer.

Refer to FIG. 2A to FIG. 2E. FIG. 2A is a cross-sectional view along the A-A line in FIG. 1. Based on FIG. 2A, FIG. 2B is a cross-sectional view showing forming a hard mask layer and a photoresist layer on the substrate. Based on FIG. 2B, FIG. 2C is a cross-sectional view showing exposing the photoresist layer to light, including electrons, so that the photoresist layer is patterned corresponding to the first microstructures 2. Based on FIG. 2C, FIG. 2D is a cross-sectional view showing etching the hard mask layer with the shades of the photoresist layer so that the hard mask layer is patterned corresponding to the first microstructures. Based on FIG. 2D, FIG. 2E is a cross-sectional view showing etching the substrate with the shades of the hard mask layer so that the first microstructures 1 is formed in the first patterned zones, and the second patterned zones remain blank. As it shown in the FIG. 2A to FIG. 2E, the method can be summarized as follows. A hard mask layer 200 and a photoresist layer 300 are formed on the substrate 1. A photolithography process is performed. According to the first embodiment of the present invention, the photolithography process means exposing the photoresist layer 300 to light, including electrons, so as to pattern the photoresist layer 300 in the first patterned zones 11. Practically, the photoresist layer 300 is selected from the group of positive photoresist and negative photoresist. The difference between two photoresists lies in: when the photoresist layer 300 is positive photoresist, the portion of the photoresist that is exposed to light becomes soluble to photoresist developer, and the portion of the photoresist that is unexposed remains insoluble to photoresist developer; when the photoresist layer 300 is negative photoresist, the portion of the photoresist that is exposed to light becomes insoluble to the photoresist developer, and the unexposed portion of the photoresist is dissolved by photoresist developer. The patterns of photoresist layer 300 are transferred to the hard mask layer 200 by an etching process so as to pattern the hard mask layer 200. The patterns of hard mask layer 200 are transferred to the substrate 1 by an etching process to form a plurality of first microstructures 2 in the first patterned zones 11, and the second patterned zones remain blank. The substrate 1 is made to be a multi-patterned substrate 1'.

In order to acquire a semiconductor with an ideal lattice on a first patterned zones, the design of first microstructures needs to follow a lattice-structure matching relationship, discovered by the strain-traction experiments as shown in FIG. 8 to FIG. 13. Therefore, after the deposition of the semiconductor buffer, strains, which are generated due to the mismatches in lattice constant and in thermal conductivity between the semiconductor buffer layer 3 and the substrate 1, are accumulated toward the outside of the first patterned zones 11. Areas outside the first pattern zones 11 includes an interval interface between the first patterned zone 11 and the second patterned zone 12 and includes areas inside the second patterned zones 12. The height 21 of the first microstructures is 0.3-10 µm, and the protrusive shape of the first microstructures 2 is selected from the group of rod, cone and pyramid.

The photolithography process is selected from the group of UV lithography, laser interference lithography, holographic lithography, E-beam lithography, X-ray lithography, Nano lithography and Nano imprinting. The etching process is selected from the group of wet etching and dry etching. Wet etching includes etching the first patterned zones 11 with an etching solution, and dry etching includes etching the first patterned zones 11 with an ICP-RIE (Inductively Coupled Plasma Reactive Ion Etching) or an RIE (Reactive Ion Etching).

Besides, ways of forming the first microstructures 2 are not limited to said steps. The photolithography process can be performed directly on the first patterned zones 11 and the second patterned zones 12 as follows. The photoresist layer 300 is formed on the first patterned zones 11 and the second patterned zones 12. The photoresist layer 300 on the first patterned zones 11 is exposed to light according to the positions of first microstructures 2. The unexposed photoresist (Here is the negative photoresist, which means the unexposed photoresist is solved) on the first patterned zones 11 and second patterned zones 12 is solved so that the patterns of first patterned zones 11 reveal (i.e. a developing step). The patterns of photoresist layer are transferred to the substrate by an etching process to form a plurality of the first microstructures in the first patterned zones, and the second patterned zones remain blank.

Ways of forming the first microstructures 2 with photolithography process and etching process are common techniques in the field and are not mentioned more here.

Figure 3:
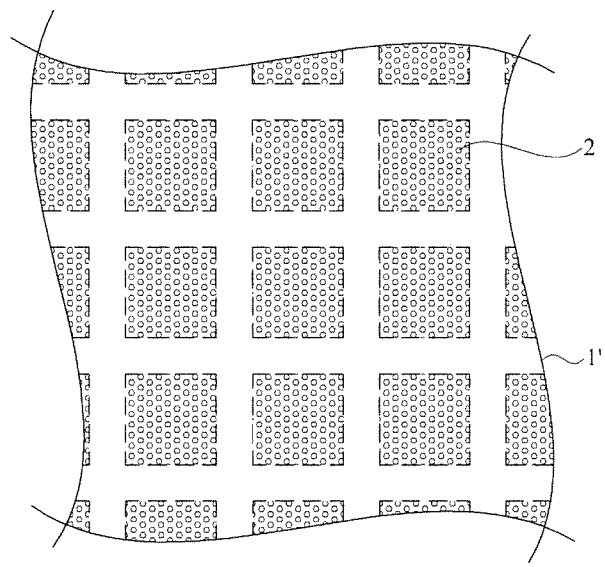
FIG. 3 is a schematic view of a multi-patterned substrate according to the first embodiment of the present invention.

Refer to FIG. 3. FIG. 3 is a schematic view of a multi-patterned substrate according to the first embodiment of the present invention. The first microstructures 2 are formed in the first patterned zones 11. According to the embodiment of the present invention, the semiconductor with the ideal lattice has a hexagonal close-packed lattice structure. In order to make the strains in the semiconductor buffer layer 3 having the hexagonal close-packed lattice to be accumulated toward the outside of the first patterned zones during deposition, the first microstructures 2 are arranged in the first patterned zones 11 with the hexagonal close-packed lattice cycle, which is defined as a first cycle P1. As a result, the residual strains in the semiconductor buffer layer 3 on the first patterned zones are relaxed after the deposition. The formula of the first cycle is:

$$P1 = nA \pm P1'$$

wherein P1 is the first cycle, n is a positive integer, A is a lattice constant of the semiconductor buffer layer, and P1'≤abs(nA)*0.15.

Preferably, the ratio value, which is defined as the height 21 of the first microstructures divided by the distance between the first microstructures, is larger than 1.

According to other embodiments of the present invention, the first microstructures 2 can be arranged in a square lattice cycle.

Refer to FIG. 2E and FIG. 4. FIG. 4 is a cross-sectional view showing depositing a semiconductor buffer layer on the multi-patterned substrate to manufacture a semiconductor template which is balanced between strains and defects according to the first embodiment of the present invention. As it shown in the figure, the additional method can be summarized as follows. The semiconductor buffer layer 3 having the semiconductor with a ideal lattice is deposited on the multi-patterned substrate 1'. The first microstructures 2 and the semiconductor with the ideal lattice need to follow a lattice-structure matching relationship, discovered by the strain-traction experiments. Therefore, a semiconductor template 100 balanced between strains and defects is manufactured. Materials of the semiconductor buffer layer 3 are selected from the group of Carbon, Silicon and Germanium; for example, C, Si, Ge, SiC or SiGe. In addition, the semiconductor buffer layer 3 also includes a compound semiconductor having materials selected from the group of Group III-V, Group II-VI and Group III-VI of the periodic table; for example, GaN, AlN, AlGaN, AlInGaN, GaAs, AlGaAs or GaAsP.

when the deposition of the semiconductor buffer layer follows the lattice-structure matching relationship, discovered by strain-traction experiments in the preferred embodiment, it is expected that the semiconductor buffer layer is affected by the difference between a strain-traction force in the semiconductor with the ideal lattice on the first patterned zones and in a semiconductor with a lattice on the second patterned zones; owing to the lower lattice-constant mismatch in the semiconductor buffer layer grown on the first microstructures, the residual strains in the semiconductor buffer layer are accumulated toward the outside of the first patterned zones; as a result, the strains in the semiconductor buffer layer on the first patterned zones are relaxed. A semiconductor template 100 which is balanced between strains and defects is manufactured. More specifically, when the semiconductor buffer layer 3 is deposited on a multi-patterned substrate, the semiconductor buffer layer with a better lattice would grow along with the protrusive shape of the first microstructures rather than the blank in the second patterned zones, and subsequently the lattice of the semiconductor buffer layer on the first patterned zones is close to an ideal lattice. Hence, the strains, which are generated from the lattice constant mismatch and different thermal conductivity between the semiconductor buffer layer 3 and the substrate 1, are accumulated toward the outside of the first patterned zones 11, and thus the defects 31 are generated toward the outside of the first patterned zones 11. The defects 31 include point defects, dislocation defects, or cracks.

Refer to FIG. 4 and FIG. 5. FIG. 5 is a cross-sectional view showing a defectless epitaxial substrate after removing the second patterned zones according to the first embodiment of the present invention. After manufacturing the semiconductor template 100, a plurality of defect-accumulated areas 12' and a plurality of strain-relaxed areas 11' corresponding to the second patterned zones 12 and the first patterned zones 11 on the semiconductor template 100, respectively, are found. The additional method is removing the defect-accumulated areas 12', and thus the strain-relaxed areas 11' are being a plurality of defectless epitaxial substrates 100'.

Figure 6:
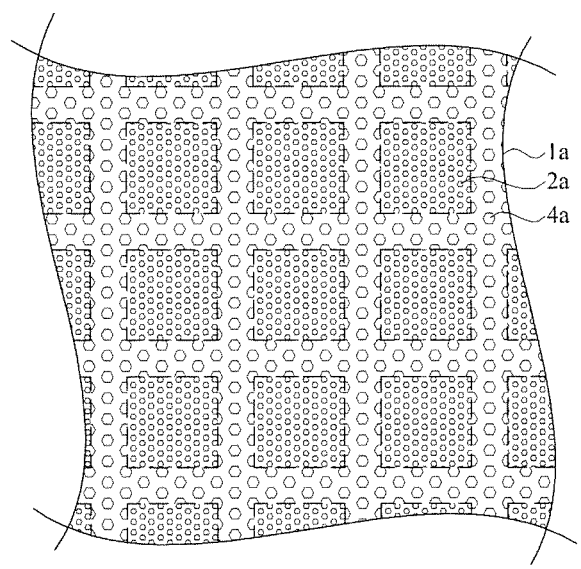
FIG. 6 is a schematic view of a multi-patterned substrate according to a second embodiment of the present invention.
Figure 7:
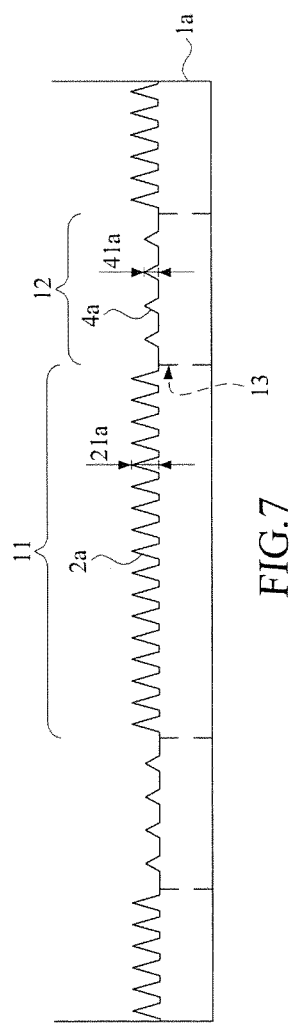
FIG. 7 is a cross-sectional view of the multi-patterned substrate according to the second embodiment of the present invention.

Refer to FIG. 6 and FIG. 7. FIG. 6 is a schematic view of a multi-patterned substrate according to a second embodiment of the present invention; FIG. 7 is a cross-sectional view of the multi-patterned substrate according to the second embodiment of the present invention. According to the figures, the multi-patterned substrate 1a is similar to the multi-patterned substrate 1', but a plurality of the second microstructures 4a are formed in the second patterned zones 12 with the photolithography process and the etching process on the multi-patterned substrate 1a. The second microstructures 4a are arranged in a second cycle P2, which is different from the first cycle. The formula of the second cycle is:

$$P2 \geq 10*(nA) \pm P2',$$

wherein P2 is the second cycle, n is a positive integer, A is a lattice constant of the semiconductor buffer layer, and $P2' \leq abs(10*(nA))$.

The height 41a of the protrusion of the second microstructures 4a is lower than the height 21a of the protrusion of the first microstructures 2a, and the difference in the protrusive height between the first microstructures and the second microstructures is within 0.05-10 μm. Furthermore, in order to discriminate the area ratio of the second microstructures 4a in one unit cell in the second patterned zone from that of the first microstructures 2a in one unit cell in the first patterned zone 11, the air-duty cycle, which is defined as the area of the second microstructures 4a in one unit cell in the second patterned zone divided by the area of the second patterned zone, is used. According to one embodiment of the present invention, the air-duty cycle in the second patterned zones 12 is under 20%; according to other embodiments of the present invention, the air-duty cycle of the second microstructures 4a in the second patterned zones 12 can be more than 80%. Considering the deposition of the semiconductor buffer layer on the multi-patterned substrate according to the second embodiment of the present invention, the semiconductor buffer layer with a better lattice would grow along with the higher protrusive shape of the first microstructures rather than the lower protrusive shape of the second microstructures. Therefore, the lattice of the semiconductor buffer layer on the first patterned zones is close to an ideal lattice. As a result, the strains, which are generated due to the lattice constant mismatch and different thermal conductivity between the semiconductor buffer layer and the multi-patterned substrate 1a, are accumulated toward the outside of the first patterned zones 11.

Figure 8:
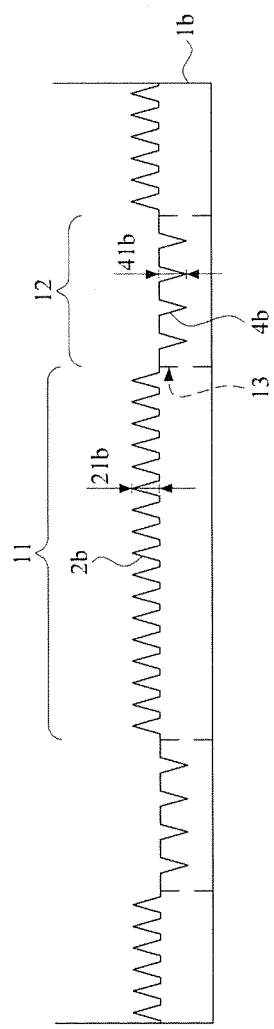
FIG. 8 is a cross-sectional view of a multi-patterned substrate according to a third embodiment of the present invention.

Refer to FIG. 8, a cross-sectional view of a multi-patterned substrate according to a third embodiment of the present invention. According to the figures, the multi-patterned substrate 1b is provided according to the third embodiment of the present invention. The multi-patterned substrate 1b is similar to the multi-patterned substrate 1', but a plurality of second microstructures 4b are formed in the second patterned zones 12 with the photolithography process and the etching process on the multi-patterned substrate 1b; the second microstructures 4a are arranged in a second cycle, which is different from the first cycle. The formula of the second cycle is:

$$P2 \geq 10*(nA) \pm P2',$$

wherein P2 is the second cycle, n is a positive integer, A is a lattice constant of the semiconductor buffer layer, and $P2' \leq abs(10*(nA))$.

The shape of second microstructures 4b are depression, and the distance from the lowest point of the second microstructures 4b to the highest point of the first microstructures 2b is within 0.2-10 μm. Furthermore, in order to discriminate the area ratio of the second microstructures in one unit cell in the second patterned zone from that of the first microstructures 2a in one unit cell in the first patterned zone 11, the air-duty cycle is used. According to one embodiment of the present invention, the air-duty cycle of the second microstructures 4b in the second patterned zones 12 is under 20%;

according to other embodiments of the present invention, the air-duty cycle of the second microstructures 4b in the second patterned zones 12 can be more than 80%. Considering the deposition of the semiconductor buffer layer on the multi-patterned substrate according to the third embodiment of the present invention, the semiconductor buffer layer with a better lattice would grow along with the higher protrusive shape of the first microstructure rather than the second microstructures with the shape of depression. Therefore, the lattice of the semiconductor buffer layer on the first patterned zones is close to an ideal lattice. As a result, the strains, which are generated due to the lattice constant mismatch and different thermal conductivity between the semiconductor buffer layer and the multi-patterned substrate 1a, are accumulated toward the outside of the first patterned zones 11.

Figure 9:
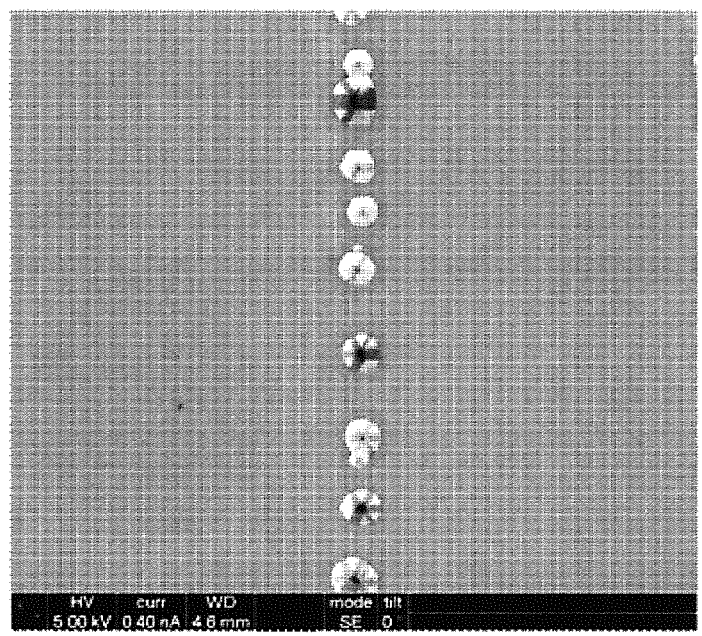
FIG. 9 is an electron microscope image of a semiconductor template according to an embodiment of the present invention.

FIG. 9 shows a secondary electron microscope image of a InGaN-based LED grown on the semiconductor template, which is according to the first embodiment of the present invention. The semiconductor template consists of a GaN-based semiconductor buffer layer and a multi-patterned sapphire substrate. The corresponding multi-patterned substrate comprises first microstructures in the first patterned zone with the area of 600 μm×600 μm, and the blank in the second patterned zone (i.e. the outside of the first patterned zone). The first microstructures have the shape of the protrusion, the first cycle P1 of 500 nm, the height of about 550 nm and the 30% air-duty cycle. As induced by the strain-traction force, dislocation defects are observed in the interval interface between the first patterned zone and the second patterned zone.

Figure 10:
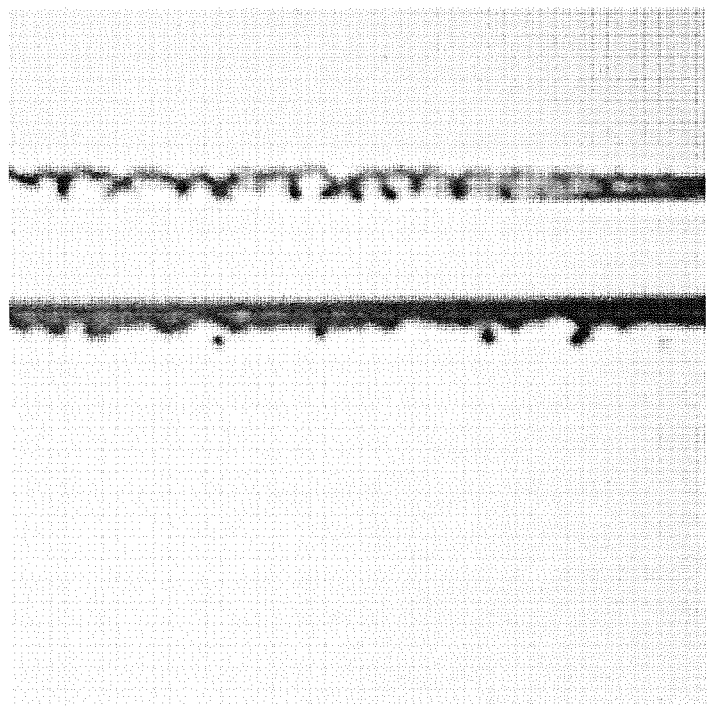
FIG. 10 is an optical microscope image of a semiconductor template according to an embodiment of the present invention.

FIG. 10 shows an optical microscope image of a InGaN-based LED grown on the semiconductor template, which is according to a first embodiment of the present invention. The semiconductor template consists of a GaN-based semiconductor buffer layer and a multi-patterned sapphire substrate. The corresponding multi-patterned substrate comprises first microstructures in the first patterned zone with the area of 600 μm×600 μm, and the blank in the second patterned zone (i.e. the outside of the first patterned zone). The first microstructures have the shape of the protrusion, the first cycle P1 of 500 nm, the height of about 550 nm and the 50% air-duty cycle. As induced by the strain-traction force, cracks are observed outside the first patterned zone.

Figure 11:
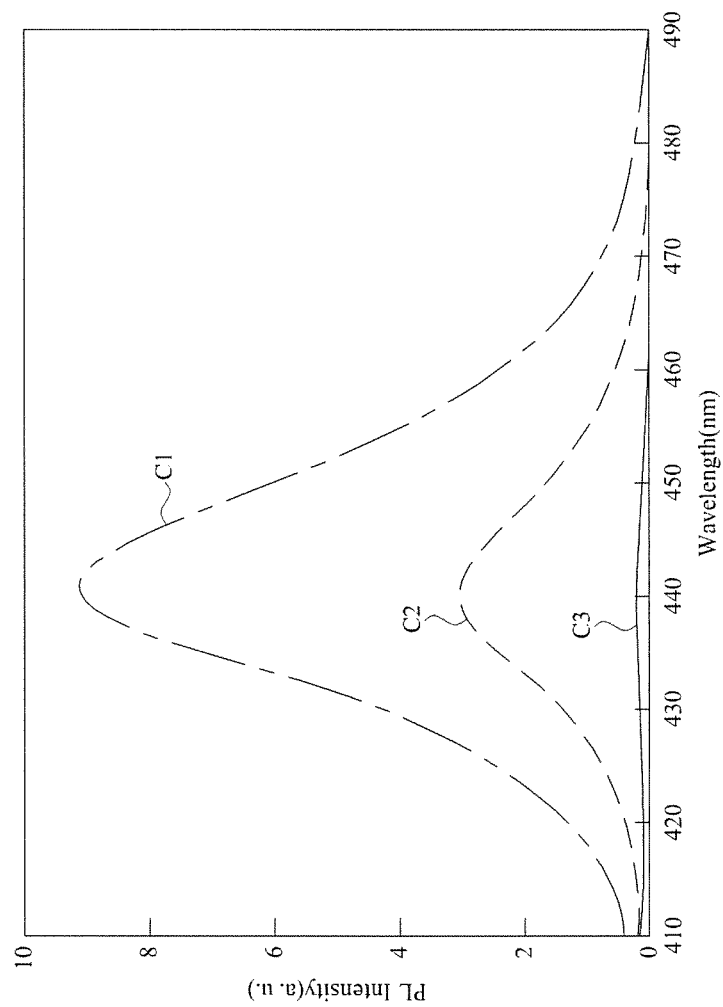
FIG. 11 is a diagram showing a room temperature photoluminescence (PL) spectrum of InGaN-based LEDs grown on the semiconductor template of FIG. 10 and on a conventional polished sapphire substrate.

FIG. 11 shows a room temperature photoluminescence (PL) spectrum of InGaN-based LEDs grown on the semiconductor template of FIG. 10 and on a conventional polished sapphire substrate. The semiconductor template consists of a GaN-based semiconductor buffer layer and a multi-patterned sapphire substrate. The InGaN-based LEDs with the semiconductor template of FIG. 10 and the conventional polished sapphire substrate were grown under the same growth conditions. According to the figure, curve C1 corresponds to the PL spectrum of the InGaN-based LED grown on the semiconductor template in the first patterned zones, curve C2 corresponds to the PL spectrum of the InGaN-based LED grown on the conventional polished sapphire substrate, and curve C3 corresponds to the PL spectrum of the InGaN-based LED grown on the semiconductor template in the second patterned zone (i.e. the outside of the first patterned zone). Due to the proper design of the first microstructures in the first patterned zones, the residual strains in the semiconductor buffer layer are accumulated toward the outside of the first patterned zones (i.e. the second patterned zone), and thus the defects are generated toward the outside of the first patterned zones. The relaxation of strains in the first patterned zones results in the reduction of Quantum-Confined Stark Effect within the InGaN/GaN multiple quantum wells. As a result, the InGaN-based LED in the strain-relaxed areas (curve C1) is 201% brighter in contrast with the sample grown on the conventional polished sapphire substrate (curve C2). There is no PL spectrum generated in defect-accumulated areas (curve C3).

Figure 12:
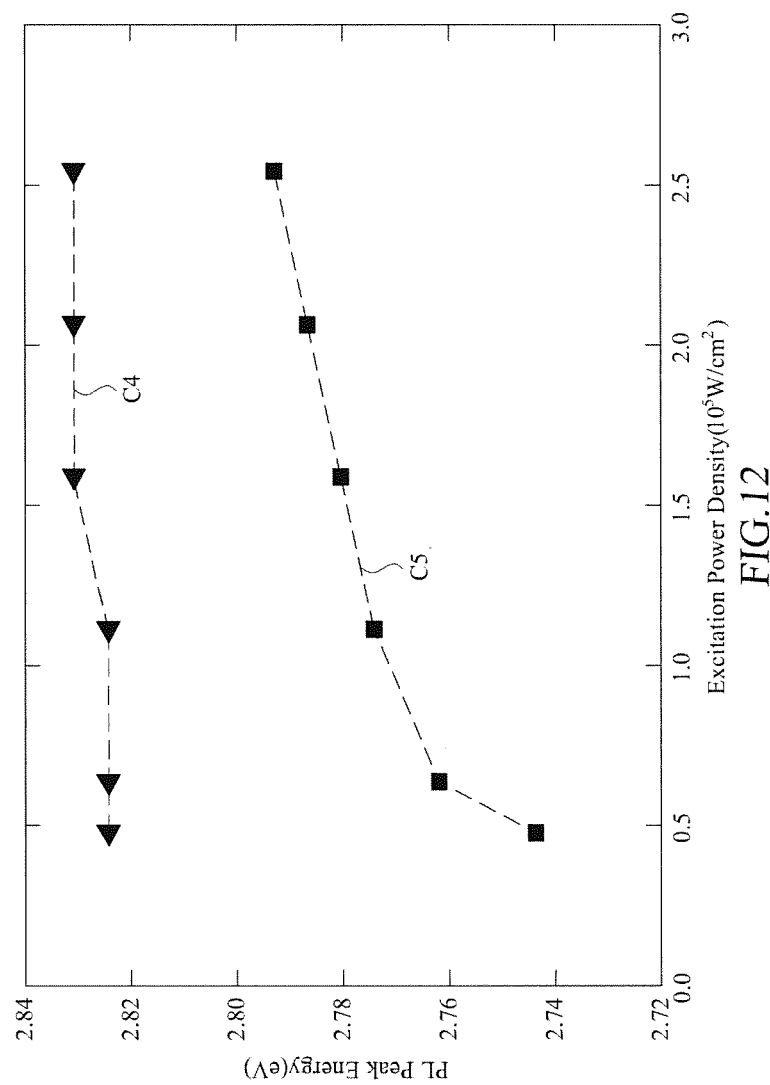
FIG. 12 is a diagram showing shifts of PL peak energy versus excitation power density of InGaN-based LEDs grown on the semiconductor template of FIG. 10 and on a conventional polished sapphire substrate.

FIG. 12 shows the shifts of PL peak energy versus excitation power density of InGaN-based LEDs grown on the semiconductor template of FIG. 10 and on a conventional polished sapphire substrate. C4 and C5 are the curves showing shifts of PL peak energy corresponding to the InGaN-based LEDs as shown in curve C1 and C2 in FIG. 11, respectively. With the increase of the excitation power density, the shifts of PL peak energy through the InGaN-based LED grown on the semiconductor template in the first patterned zones (i.e. C4) is smaller than the sample grown on the conventional polished sapphire substrate (i.e. C5). Wherein the InGaN-based LED grown on the conventional polished sapphire substrate (i.e. C5) exhibits the large energy shifts of 54 meV, and the InGaN-based LED grown on the semiconductor template in the first patterned zones (i.e. C4) exhibits the energy shifts of only 6.45 meV. The phenomenon of the small shifts for the InGaN-based LED grown on the semiconductor template in the first patterned zones (i.e. C4) is a result of the much reduction of Quantum-Confined Stark Effect within the multiple quantum wells due to the relaxation of strains in semiconductor buffer layer on the first microstructures.

Figure 13:
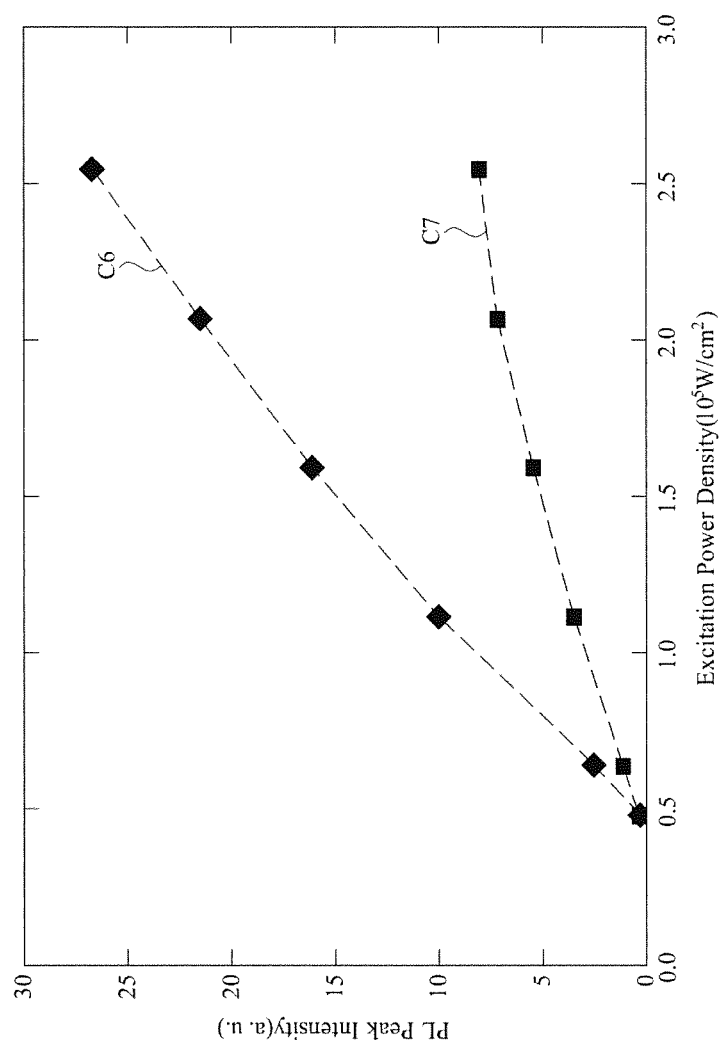
FIG. 13 is a diagram showing the PL peak intensity versus excitation power density of InGaN-based LEDs grown on the semiconductor template of FIG. 10 and on a conventional polished sapphire substrate.

FIG. 13 shows the PL peak intensity versus excitation power density of InGaN-based LEDs grown on the semiconductor template of FIG. 10 and on a conventional polished sapphire substrate. C6 and C7 are curves showing the PL peak intensity corresponding to the InGaN-based LEDs as shown in curve C1 and C2 in FIG. 11. With the increase of the excitation power density, the much more linear enhancement of the PL peak intensity of the InGaN-based LED grown on the semiconductor template in the first patterned zones (i.e. C6) occurs as compared with the sample grown on the conventional polished sapphire substrate (i.e. C5). The saturation behavior is shown in the PL peak intensity of the InGaN-based LED grown on the conventional polished sapphire substrate (i.e. C5) under high excitation power. It is attributed to the Quantum-Confined Stark Effect significantly within the multiple quantum wells.

According to the disclosure of embodiments of the present invention, persons having ordinary skills in the art should be able to understand that:

I. According to embodiments of the present invention, the method includes forming the first microstructures in the first patterned zones of the substrate; thus, when depositing the semiconductor buffer layer on the substrate, the strains, which are generated due to the mismatches in lattice constant and in thermal conductivity between the semiconductor buffer layer and the substrate, are attracted toward the outside of the first patterned zones.

II. The first microstructures and second microstructures having difference are formed corresponding to the first patterned zones and the second patterned zones. By means of the difference between the first microstructures and second microstructures, strains, which are generated due to the mismatches in lattice constant and in thermal conductivity between the semiconductor buffer layer and the substrate, are attracted toward the outside of the first patterned zones. The difference between the first microstructures and second microstructures includes height, cycle, or area ratio.

III. In order to solve the problems of defects generated by strains when depositing the semiconductor buffer layer on substrates of different lattice structures, substrate utilized in embodiments of the present invention is selected from the group of SiC substrate, Si substrate and sapphire substrate, which is different from the materials of the semiconductor buffer layer (the semiconductor buffer layer includes a compound semiconductor having materials selected from the group of Group III-V, Group II-VI and Group III-VI of the periodic table).

While the present invention has been particularly shown and described with reference to a preferred embodiment, it will be understood by those skilled in the art that various changes in form and detail may be without departing from the spirit and scope of the present invention.

What is claimed is:

1. A method for manufacturing a semiconductor template balanced between strains and defects, discovered by strain-traction experiments in a preferred embodiment, the method comprising steps of:
    (a) preparing a substrate, dividing the substrate into a plurality of first patterned zones and a plurality of second patterned zones, the second patterned zones applied to separate the first patterned zones;
    (b) selecting a semiconductor with an ideal lattice of a semiconductor buffer layer to be deposited on the substrate;
    (c) etching a plurality of first microstructures in the first patterned zones according to the semiconductor with the ideal lattice, the first microstructures and the semiconductor with the ideal lattice following a lattice-structure matching relationship, discovered by strain-traction experiments, making the substrate a multi-patterned substrate; and
    (d) depositing the semiconductor buffer layer having the semiconductor with the ideal lattice on the multi-patterned substrate to manufacture a semiconductor template balanced between strains and defects;
    wherein when the deposition of the semiconductor buffer layer follows the lattice-structure matching relationship, discovered by strain-traction experiments in the preferred embodiment, it is expected that the semiconductor buffer layer is affected by the difference between a strain-traction force in the semiconductor with the ideal lattice on the first patterned zones and in a semiconductor with a lattice on the second patterned zones; owing to the lower lattice-constant mismatch in the semiconductor buffer layer grown on the first microstructures, the residual strains in the semiconductor buffer layer are accumulated toward the outside of the first patterned zones; as a result, the strains in the semiconductor buffer layer on the first patterned zones are relaxed.

2. The method according to claim 1, wherein the second patterned zones are connected so the first patterned zones are disposed into an array among the second patterned zones.

3. The method according to claim 1, wherein step (c) includes etching the first microstructures within the height of 0.3-10 μm in the first patterned zones.

4. The method according to claim 1, wherein step (c) includes forming a photoresist layer on the substrate and forming the first microstructures in the first patterned zones with a photolithography process and an etching process.

5. The method according to claim 4, wherein step (c) includes forming a plurality of second microstructures in the second patterned zones with the photolithography process and the etching process, and the height difference from the highest point of the first microstructures to the lowest point of the second microstructures is within 0.2-10 μm.

6. The method according to claim 4, wherein step (c) includes forming the second microstructures in the second patterned zones with the photolithography process and the etching process, and the height difference from the highest point of the first microstructures to the highest point of the second microstructures is within 0.05-10 μm.

7. The method according to claim 4, wherein step (c) includes forming the second microstructures in the second patterned zones with the photolithography process and the etching process, and the first microstructures and the second microstructures are arranged in different cycles.

8. The method according to claim 7, wherein the first microstructures are arranged in a first cycle; the formula of the first cycle is $P1=nA \pm P1'$, P1 being the first cycle, n being a positive integer, A being lattice constant of the semiconductor buffer layer, and $P1' \leq abs(nA)*0.15$.

9. The method according to claim 8, wherein the second microstructures are arranged in a second cycle different from the first cycle; the formula of the second cycle is $P2 \geq 10*(nA) \pm P2'$, P2 being the second cycle, n being a positive integer, A being the lattice constant of the semiconductor buffer layer, and $P2' \leq abs(10*(nA))$.

10. The method according to claim 4, wherein a hard mask layer is formed on the substrate before the photoresist layer is formed, and the photoresist layer is formed on the hard mask layer.

11. The method according to claim 4, wherein the photolithography process is selected from the group of UV lithography, laser interference lithography, holographic lithography, E-beam lithography, X-ray lithography, Nano lithography and Nano imprinting; the etching process is selected from the group of wet etching and dry etching.

12. The method according to claim 1, wherein the area of the first patterned zones is less than 4 cm$^2$.

13. The method according to claim 1, wherein materials of the semiconductor buffer layer are selected from the group of Carbon, Silicon and Germanium.

14. The method according to claim 1, wherein the semiconductor buffer layer includes a compound semiconductor having materials selected from the group of Group III-V, Group II-VI and Group III-VI of the periodic table.

15. The method according to claim 1, wherein the defects are selected from the group of point defects, dislocation defects and cracks.

* * * * *